(12) United States Patent
Robinson et al.

(10) Patent No.: US 10,058,015 B2
(45) Date of Patent: Aug. 21, 2018

(54) SOLDERABLE TWO PIECE BOARD LEVEL SHIELDS

(71) Applicant: Laird Technologies, Inc., Earth City, MO (US)

(72) Inventors: Kenneth M. Robinson, Effort, PA (US); Paul W. Crotty, East Stroudsburg, PA (US)

(73) Assignee: LAIRD TECHNOLOGIES, INC., Earth City, MO (US)

( * ) Notice: Subject to any disclaimer, the term of this patent is extended or adjusted under 35 U.S.C. 154(b) by 0 days.

(21) Appl. No.: 15/453,166

(22) Filed: Mar. 8, 2017

(65) Prior Publication Data

US 2017/0181336 A1 Jun. 22, 2017

Related U.S. Application Data

(63) Continuation of application No. PCT/US2015/060554, filed on Nov. 13, 2015.

(60) Provisional application No. 62/080,165, filed on Nov. 14, 2014.

(51) Int. Cl.
*H05K 9/00* (2006.01)
*H05K 1/02* (2006.01)

(52) U.S. Cl.
CPC ......... *H05K 9/0032* (2013.01); *H05K 9/0009* (2013.01); *H05K 1/0216* (2013.01); *H05K 9/00* (2013.01); *H05K 2201/10371* (2013.01)

(58) Field of Classification Search
CPC ....... H05K 9/0032; H05K 2201/10371; H05K 9/0028; H05K 1/0216; H05K 9/00; H05K 9/0009; H01L 23/552; H01R 13/6271; H01R 13/65802; H01R 13/6594; H01R 4/64
See application file for complete search history.

(56) References Cited

U.S. PATENT DOCUMENTS

| | | |
|---|---|---|
| 6,482,520 B1 | 11/2002 | Tzeng |
| 6,503,626 B1 | 1/2003 | Norley et al. |
| 6,841,250 B2 | 1/2005 | Tzeng |
| 7,138,029 B2 | 11/2006 | Norley et al. |
| 7,150,914 B2 | 12/2006 | Clovesko et al. |

(Continued)

OTHER PUBLICATIONS

International Search Report and Written Opinion for PCT Application No. PCT/US2015/060554 filed Nov. 13, 2015 (published as WO 2016/077683 on May 19, 2016) which is the parent application to the instant application; dated Mar. 16, 2016, 12 pages.

*Primary Examiner* — James Wu
(74) *Attorney, Agent, or Firm* — Harness, Dickey & Pierce, P.L.C.; Anthony G. Fussner

(57) ABSTRACT

According to various aspects, exemplary embodiments are disclosed of a two-piece metallic board level shield (BLS). In an exemplary embodiment, the BLS is solderable to a printed circuit board (PCB). The BLS includes a lid or cover and a fence or frame. The lid and fence are complementary in shape. The lid may be mounted onto the fence via a locking mechanism in a first position and a compressed second position, where the locking mechanism provides resistance against internal upward forces when the BLS has been compressed into a second position. The BLS may be soldered to the PCB while in the first position, and subsequently compressed into the second position after the solder has hardened.

20 Claims, 7 Drawing Sheets

(56) References Cited

U.S. PATENT DOCUMENTS

| | | |
|---|---|---|
| 7,160,619 B2 | 1/2007 | Clovesko et al. |
| 7,267,273 B2 | 9/2007 | Silverbrook et al. |
| 7,303,820 B2 | 12/2007 | Capp et al. |
| 7,488,902 B2 | 2/2009 | English et al. |
| 7,623,360 B2 | 11/2009 | English et al. |
| 2007/0042188 A1 | 2/2007 | Clovesko et al. |
| 2007/0077434 A1 | 4/2007 | Clovesko et al. |
| 2007/0210082 A1* | 9/2007 | English ............... H05K 9/0032 220/4.21 |
| 2011/0204280 A1 | 8/2011 | Bruzda |
| 2014/0262473 A1 | 9/2014 | Robinson et al. |

* cited by examiner

SOLDERABLE TWO PIECE BOARD LEVEL SHIELDS

CROSS-REFERENCE TO RELATED APPLICATIONS

This application is a continuation of PCT International Application No. PCT/US2015/060554 filed Nov. 13, 2015 (published as WO 2016/077683 on May 19, 2016), which, in turn, claims priority to and the benefit of U.S. Provisional Application No. 62/080,165 filed Nov. 14, 2014. The entire disclosures of the above applications are incorporated herein by reference.

FIELD

The present disclosure generally relates to solderable two piece board level shields.

BACKGROUND

This section provides background information related to the present disclosure which is not necessarily prior art.

Electromagnetic interference (EMI) shielding is an important aspect of electronic device manufacture and function. EMI may cause undesirable performance or failure of electronic components in an electronic device. EMI shielding may be achieved by a variety of manners, including through the use of a metallic board level shield (BLS). Such shields may be solderable to printed circuit boards (PCBs), and some are two-piece shields that include solderable walls (e.g., a frame, discrete sidewalls, etc.) and a cover or lid that is attachable thereto. A BLS may thusly enclose electrical or electronic components on the PCB and provide EMI mitigation or elimination. In certain applications, it may be desirable to have additional materials on the underside of the BLS, including the underside of the BLS lid when a two-piece shield is used.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

SUMMARY

This section provides a general summary of the disclosure, and is not a comprehensive disclosure of its full scope or all of its features.

According to various aspects, exemplary embodiments are disclosed of a two-piece metallic board level shield (BLS). In an exemplary embodiment, the BLS is solderable to a printed circuit board (PCB). The BLS includes a lid or cover and a fence or frame. The lid and fence are complementary in shape. The lid may be mounted onto the fence via a locking mechanism in a first position and a compressed second position, where the locking mechanism provides resistance against internal upward forces when the BLS has been compressed into a second position. The BLS may be soldered to the PCB while in the first position, and subsequently compressed into the second position after the solder hardens.

Further areas of applicability will become apparent from the description provided herein. It should be understood that the description and specific examples are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 shows the lid in a first position for soldering the fence to a printed circuit board (PCB), and FIG. 2 shows the lid in a second position after the fence has been soldered to the PCB;

FIG. 3 shows the lid in the first position, and FIG. 4 shows the lid in the second position;

FIG. 6 shows the lid in the first position, and FIG. 7 shows the lid in the second position;

Corresponding reference numerals indicate corresponding parts throughout the several views of the drawings.

DETAILED DESCRIPTION

Example embodiments will now be described more fully with reference to the accompanying drawings.

As noted above, electronic circuits or components of a printed circuit board (PCB) are often enclosed with shields to localize EMI within its source, and to insulate other devices proximal to the EMI source. One known way to form these shields is by stamping a piece of material using, for example, a die stamping process to form an enclosure, and then folding side portions of the stamped piece of material downward, generally perpendicularly to form side walls. The shield may then be installed to the PCB to enclose the desired electronic circuits or components.

According to various aspects, exemplary embodiments are disclosed herein of a two-piece metallic board level shield (BLS) solderable to a PCB. Where a BLS intends to protect the electrical components on the PCB, a two-piece lid and fence (or cover and frame) arrangement may be used, where the fence is a perimeter of vertical metal (or other electrically-conductive material) with respect to a horizontal planar PCB. The fence includes a substantially flush bottom that meets the PCB for soldering. The lid is generally complementary in shape to the fence, such that the lid may be placed over the fence (e.g., to cover an open top defined by the fence, etc.) to create a substantially complete barrier to EMI.

In various applications, one or more materials may be included on the underside of the lid, such that when the lid is placed on a fence that has been soldered to the PCB, the materials on the underside of the lid may interact with or protect the electronic components covered by the shield. In some applications, one or more thermal interface materials (TIMs) may be included on the underside of the lid and may come into direct contact with one or more electronic components or other heat sources. In other applications, the interface material may be an EMI absorber (e.g., thermally-conductive EMI absorber, a hybrid thermal/EMI absorbers, etc.), additional EMI shielding material, thermally-conductive electrical insulator, etc.

Where a TIM is included on the underside of the shield lid, a snug fit of the TIM against the electronic component(s) may be desirable for optimal performance. As these shields may be soldered to the PCB, in many instances a snug fit may impede a complete soldering of the fence to the PCB around the perimeter of the shield. The shields of this disclosure aim to address this, among other applications.

Figure 1:
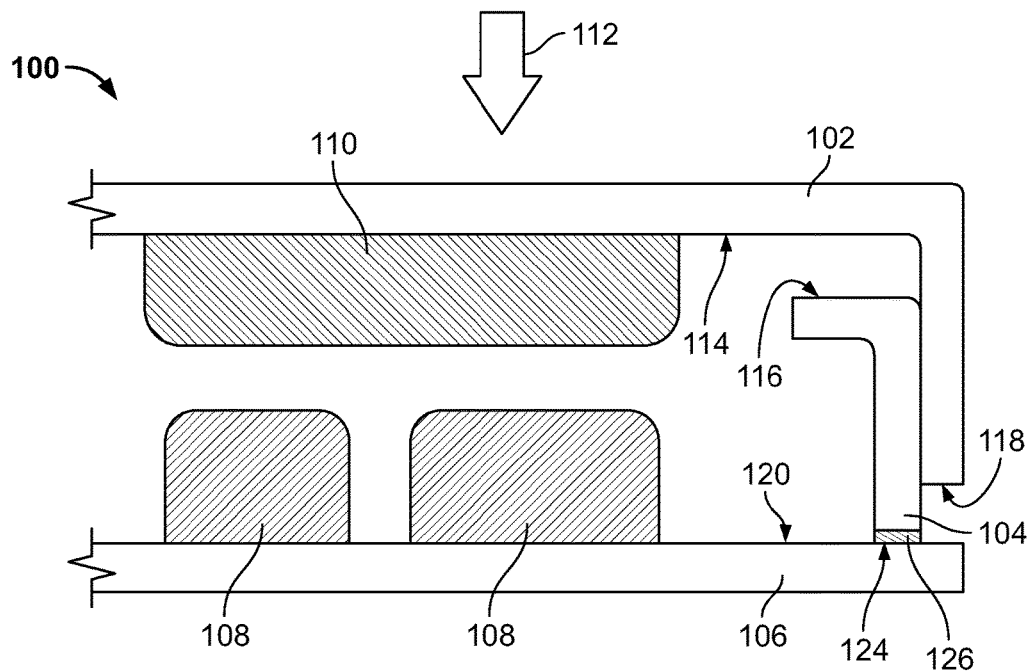
FIGS. 1 and 2 are cross-sectional views of a portion of a two-piece shield including a lid and fence according to an exemplary embodiment of the present disclosure, where

Turning to the figures, FIG. 1 shows an edge portion of a two-piece shield 100 according to an exemplary embodiment of the disclosure. The shield 100 includes a lid or cover 102 and a fence or frame 104. In FIG. 1, the lid 102 is shown in a first position in which the lid 102 is attached to the fence 104, though it is not fully compressed. The fence 104 has been installed or mounted on a PCB 106 having electronic components 108 thereon. Additionally, an interface material 110 is present on an underside 114 of the lid 102. The interface material 110 may, for example, comprise one or more thermal interface materials (e.g., a thermally-conductive compliant material, etc.).

From this first position shown in FIG. 1, the lid 102 may be compressed downwardly in a locking direction 112 to reach the configuration or second position shown in FIG. 2, which will be discussed subsequently. While in this first position, the underside 114 of the lid 102 remains separated and spaced apart from the lip 116 or other upper terminating or uppermost surface of the fence 104. Similarly, the base 118 of the lid 102, which is the terminating lower edge or bottommost portion around the perimeter of the lid 102, remains separated and spaced apart from the upper surface 120 of the PCB 106. The bottom 124 of the fence 104 has been soldered 126 to the PCB 106. The solder 126 may be in any acceptable form known in the art, depending on the particular application and shield installed, including but not limited to solder in bead, ball, or strip form, etc.

Figure 2:
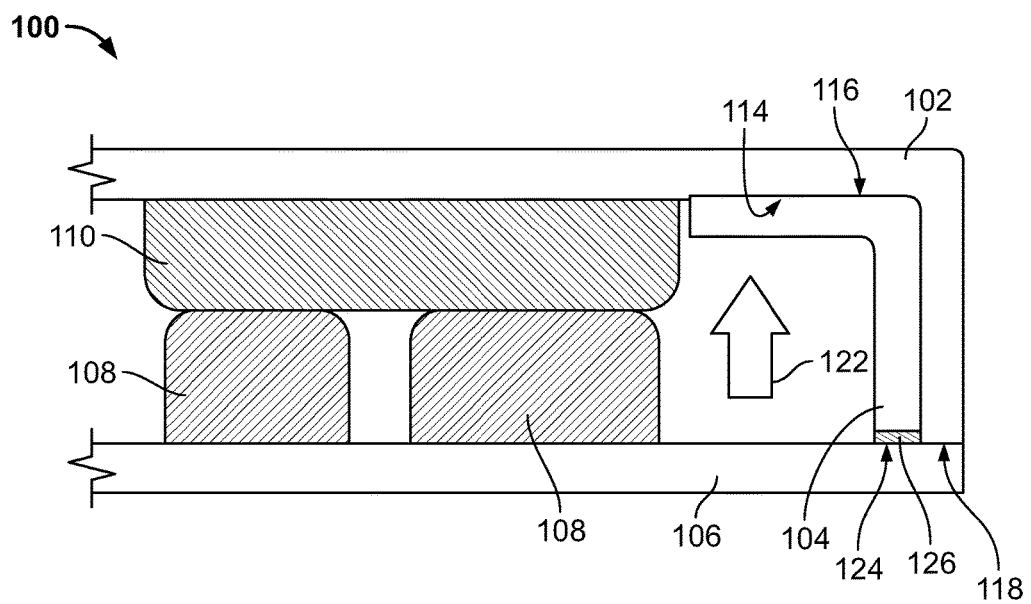

Applying a downward force to the lid 102 in the locking direction 112 results in the lid 102 moving relative to (e.g., ratcheting downward onto, etc.) the fence 104 from the first position (FIG. 1) to the second position or configuration (FIG. 2). FIG. 2 shows the shield 100 in a second, compressed position in which the underside 114 of the lid 102 meets (e.g., contacts, touches, etc.) the lip 116 or other upper terminating surface of the fence 104. Similarly, the base 118 of the lid 102 meets (e.g., contacts, touches, etc.) the upper surface 120 of the PCB 106 when the shield 100 is in the second position shown in FIG. 2.

In the compressed second position of FIG. 2, the interface material 110 is pushed down and against the electronic components 108 of the PCB 106. This results in an upward force 122 (e.g., a clamping force, etc.) such that the lid 102 is being pushed away from the fence 104. A lid-to-fence locking mechanism 128 is thus provided to maintain the EMI shielding of the BLS 100 and the snug contact of the interface material 110 to the electronic components 108 of the PCB 106.

Figure 3:
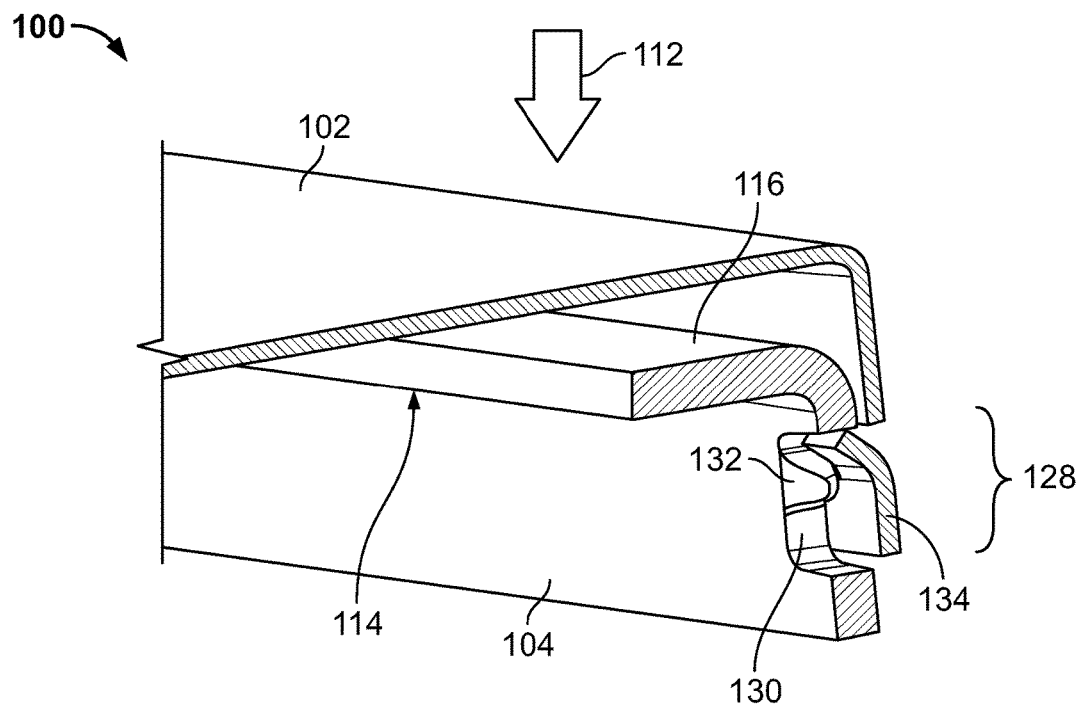
FIGS. 3 and 4 are perspective cross-sectional views of a portion of the two-piece shield shown in FIGS. 1 and 2, and showing a lid-to-fence (or cover-to-frame) locking mechanism according to an exemplary embodiment, where
Figure 4:
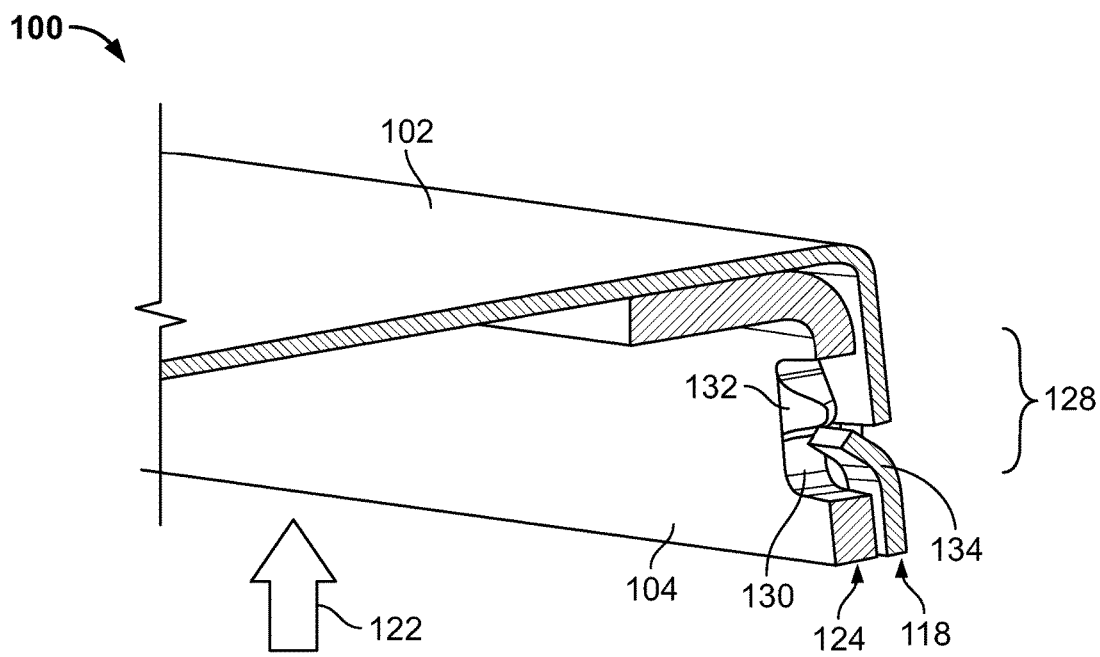

FIGS. 3 and 4 show a portion of the two-piece shield 100 including a lid-to-fence locking mechanism 128 according to an exemplary embodiment. FIG. 3 shows the shield 100 in a first position, and FIG. 4 shows the shield 100 in a second position. FIG. 3 includes a cross-sectional view that bisects the locking mechanism.

In this particular embodiment, the locking mechanism 128 includes a window or opening 130 in the fence 104 having one or more tabs 132 thereon. The lid 102 includes a detent 134, which is part of the locking mechanism 128. The tabs 132 and detent 134 may also be referred to as first and second locking members.

Figure 5:
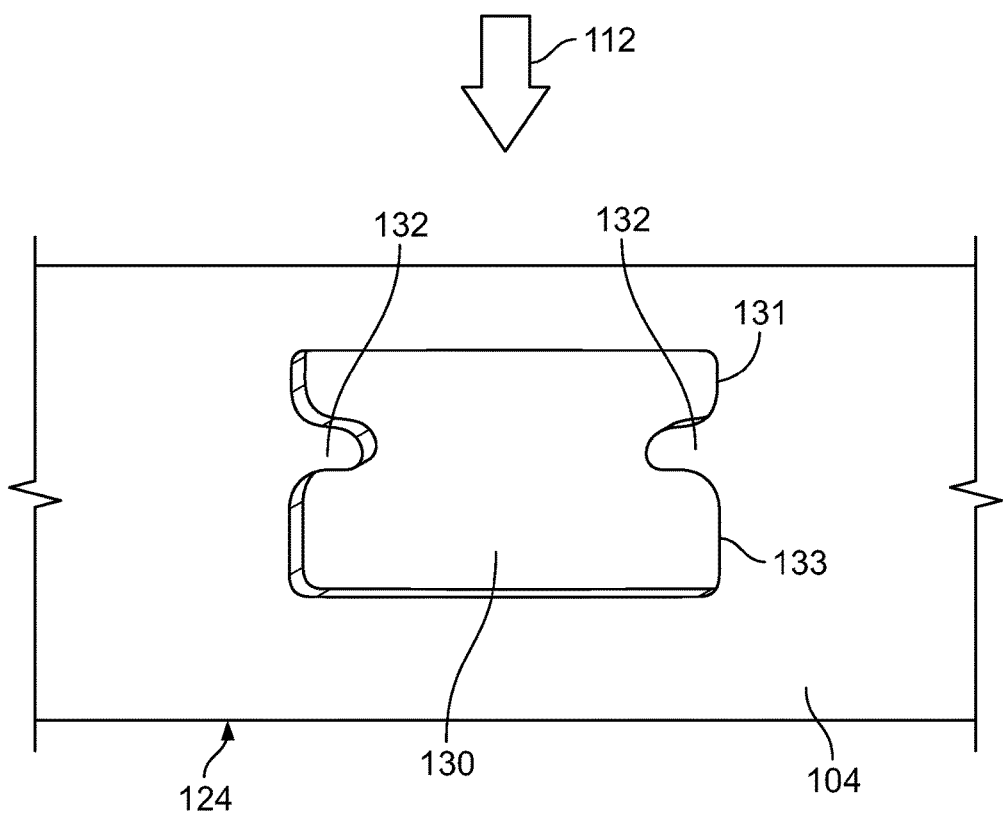
FIG. 5 illustrates a portion of the fence of the two-piece shield shown in FIGS. 1 through 4, and showing a window in the fence according to an exemplary embodiment.
Figure 6:
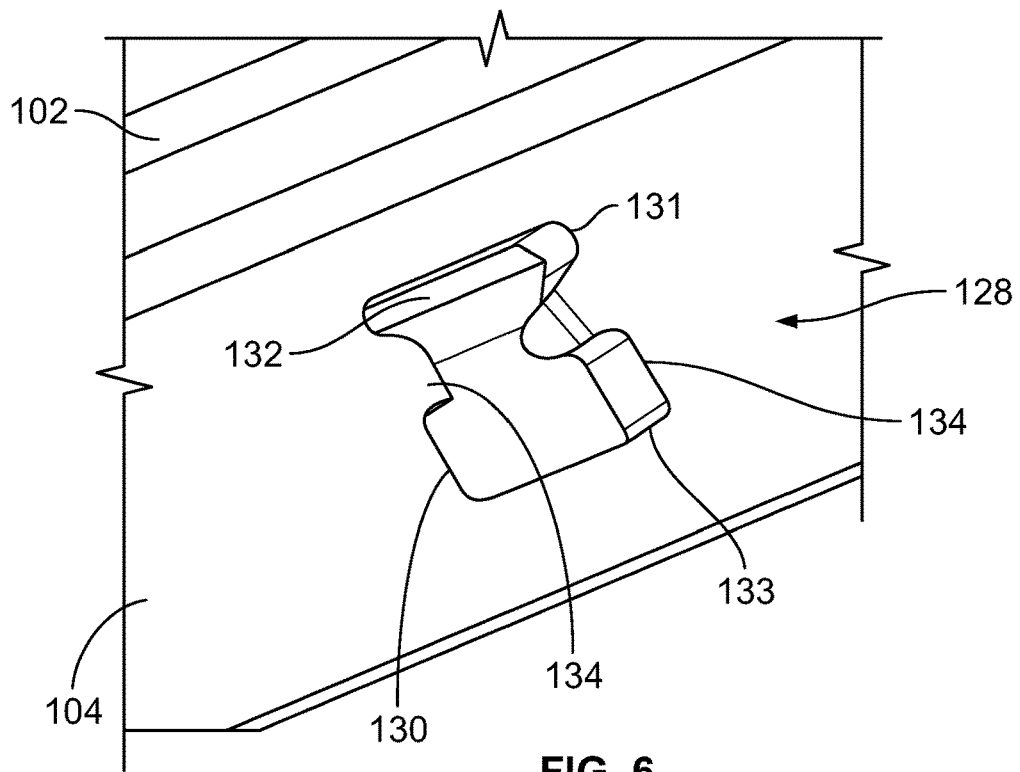
FIGS. 6 and 7 are perspective views of an interior portion of the shield shown in FIGS. 1 through 5, and showing the lid-to-fence (or cover-to-frame) locking mechanism, where
Figure 7:
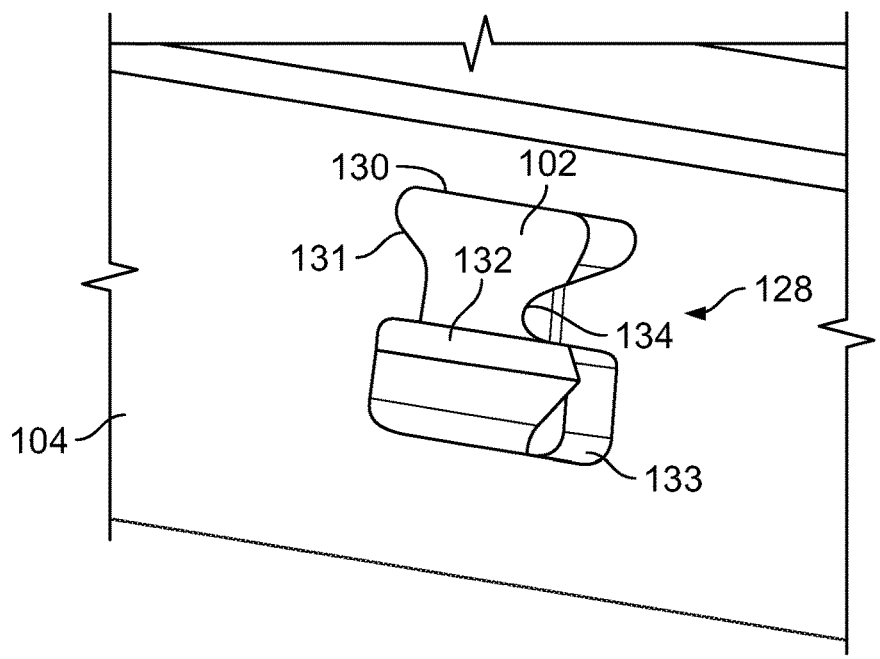

As shown in FIGS. 5, 6, and 7, the window 130 and tabs 132 may cooperatively define a generally hourglass shape. The tabs 132 may comprise portions of the fence 104 that remain when the window 130 was formed (e.g., stamped, cut, etc.) in the fence 104. The tabs 132 may comprise portions of the fence 104 that extend or protrude inwardly towards each other from opposite sides of the window 130. A spaced distance separates the end portions of the tabs 132 from each other. The tabs 132 may also be bent or otherwise formed so as to bend, curve, extend, etc., outwardly relative to the window 130 and interior of the shield 100, which may help create a more securing locking engagement between the detent 134 and the tabs 132. Alternative embodiments may include the window 130 and tabs 132 configured differently, e.g., cooperatively defining other shapes, having a single tab extending across the window 130, etc.

The detent 134 may be a cut and inwardly bent portion (e.g., rectangular or non-rectangular tab or flap, etc.) of the lid 102 such that the lid 102 may be engaged in the first and second positions. In this exemplary way, the detent 134 and tabs 132 together form a click-type mechanism that allows a one way movement of the lid-to-fence. In other words, the lid 102 may be readily placed onto the fence 104 and into a first position, and subsequently moved into a second position by pushing downwardly on the lid 102 in the locking direction 112, while it is comparably quite difficult to remove the lid 102 without deforming the lid 102 to disengage the locking mechanism 128.

In the first position, the free end of the detent 134 is positioned within an upper or first portion 131 of the window 130 above the tabs 132. As shown in FIG. 6, the tabs 132 (e.g., outwardly curved portions of the tabs 132) are disposed under and in contact with the detent 134 (e.g., with a lower surface of the detent 134). This interaction or contact between the detent 134 and tabs 132 may help hold the lid 102 in a raised position relative to the fence 104 until a force is applied to the lid 102 in the downward direction 112 (FIG. 3), such that the underside 114 of the lid 102 remains separated and spaced apart from the inwardly extending flange or lip 116 or other upper terminating surface of the fence 104 and such that the base 118 of the lid 102 (which is the terminating lower edge around the perimeter of the lid 102) remains separated and spaced apart from the upper surface 120 of the PCB 106.

In the second position, the free end of the detent 134 is positioned within a lower or second portion 133 of the window 130 below the tabs 132. As shown in FIG. 7, the tabs 132 (e.g., outwardly curved portions of the tabs 132) are disposed above and in contact with the detent 134 (e.g., with an upper surface of the detent 134). This interaction or contact between the detent 134 and tabs 132 may help hold the lid 102 in a lowered position relative to the fence 104. In the compressed second position, the interface material 110 (FIG. 1) along the underside 114 of the lid 102 will be pushed down and against the electronic components 108 of the PCB 106. This results in the upward force 122 that pushes the lid 102 away from the fence 104. Despite the upward force 122, the lid 102 is held in place on the fence 104 in the second position by the engagement of the detent 134 and tabs 132 of the lid-to-fence locking mechanism 128.

FIG. 4 shows the shield 100 after having been compressed into the second position. Comparing FIGS. 3 and 4, one can see that the detent 134 in FIG. 3 is above (relative to the base 124 of the fence 104) the tab 132, whereas in FIG. 4 the detent 134 is below the tab 132. Given the angle, shape, and positioning of the detent 134 relative to the tab 132, one can readily see that the removal of the lid 102 would require disengagement of the locking mechanism 128, which might include the deformation or destruction of the lid 102 and/or detent 134.

With the downward movement of the lid 102 relative to the fence 104, the detent 134 of the lid 102 may contact and slide along the tabs 132 within the window 130 of the fence 104. The sliding contact of the detent 134 with the tabs 132 may cause the detent 134 to flex, deform, move, pivot, or cam outwardly from its original or initial position above the tabs 132 within an upper or first portion 131 of the window 130 shown in FIGS. 3 and 6. This outward movement of the detent 134 allows the detent 134 to move across and below the tabs 132 and into a lower or second portion 133 of the window 130. The detent 134 of the lid 102 may be generally resilient in nature so that the detent's free end may be flexed generally outwardly. Then, after the free end of the detent 134 has moved past the tabs 132 of the fence 104 and into alignment with the lower portion 133 of the window 130, the resilient nature of the detent 134 may cause the detent 134 to move (e.g., snap back, recoil or spring back into shape after bending, etc.) generally under the tabs 132 and into the lower portion 133 of the window 130. At which point, the detent 134 is engaged and retained under the tabs 132 thereby retaining the lid 102 to the fence 104. In some exemplary embodiments, a tactile and/or audible indication (e.g., a click, etc.) may be produced when the detent 134 moves underneath the tabs 132.

FIG. 5 shows an exemplary embodiment of a window 130 of the locking mechanism of the disclosure. The window 130 is on a section of the fence 104 of the shield 100. The window 130 has or defines a pair of tabs 132, which are substantially similar in shape in this exemplary embodiment. The window 130 and tabs 132 in unison provide a complementary shape to enable the detent 134 of the lid 102 to engage the fence 104 in first and second positions, as disclosed herein.

Figure 12:
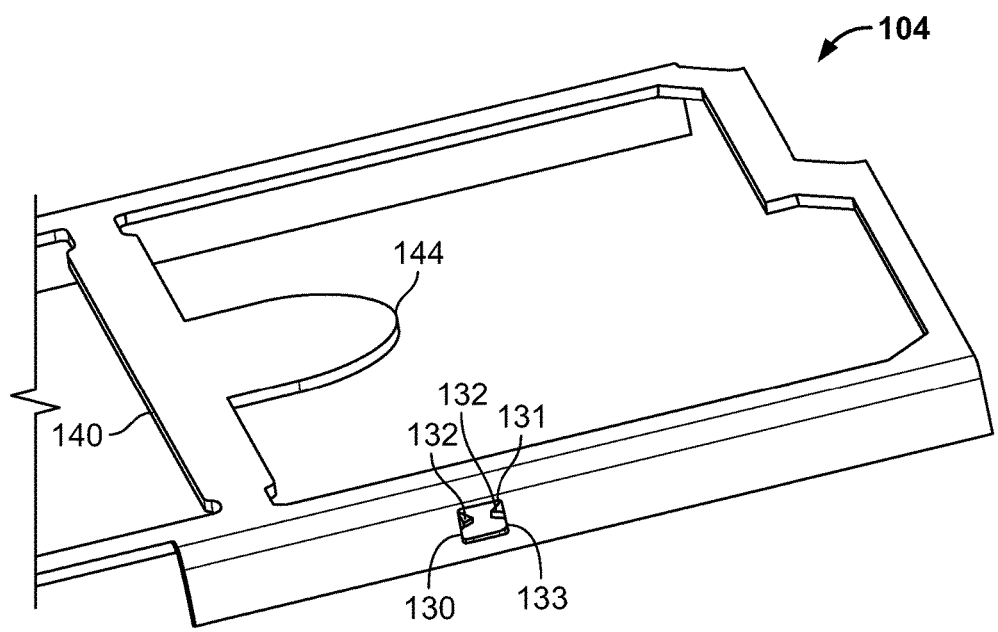
FIG. 12 is a perspective view of a fence including a window according to an exemplary embodiment.

In light of the upward forces 122 that may be experienced by the BLS 100 in the locked second position, a series of locking mechanisms 128 may be needed or preferred around the perimeter of the fence 104. Additionally, these forces may require that the shield 100 include features that promote rigidity, such as drawn portions of corner sections, cross members connected between sidewalls of the fence 104 and extending across the open top of the fence 104, and/or other features. For example, FIG. 12 shows an arm or support member 140 extending across the fence 104. Also shown in FIG. 12 is a pick-up area 144 that may be configured to facilitate handling of the fence 104 by pick-and-place equipment. Accordingly, attaching the lid 102 to the fence 104 in the first position may include picking up and placing the lid 102 on the fence 104 using pick and place equipment.

It should be noted that the locking mechanism 128 shown in the figures is non-limiting. Any complementary physical configurations of the lid and fence that provides interlocking features that resist upward forces from within the BLS are embraced by this disclosure.

FIGS. 6 and 7 show an interior portion of the shield 100 including the lid-to-fence locking mechanism 128. In FIGS. 6 and 7, one may see the complementary relationship of the detent 134 and the window 130 and tabs 132, where the full locking mechanism is provided. FIG. 6 shows the shield 100 in a first position, and FIG. 7 shows the shield 100 in a second position.

Figure 8:
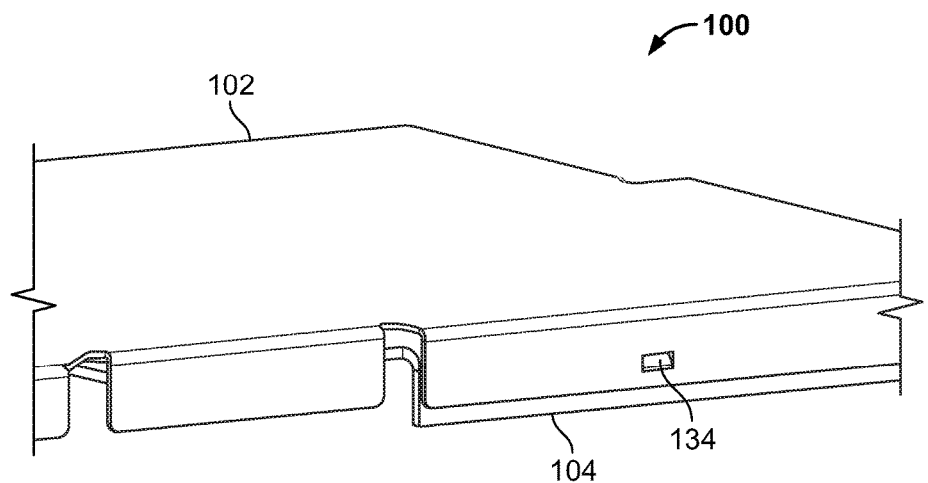
FIGS. 8 and 9 are respective outer and inner perspective views of portions of the shield shown in FIGS. 1 through 7, where the lid is shown in the first or raised position relative to the fence.
Figure 9:
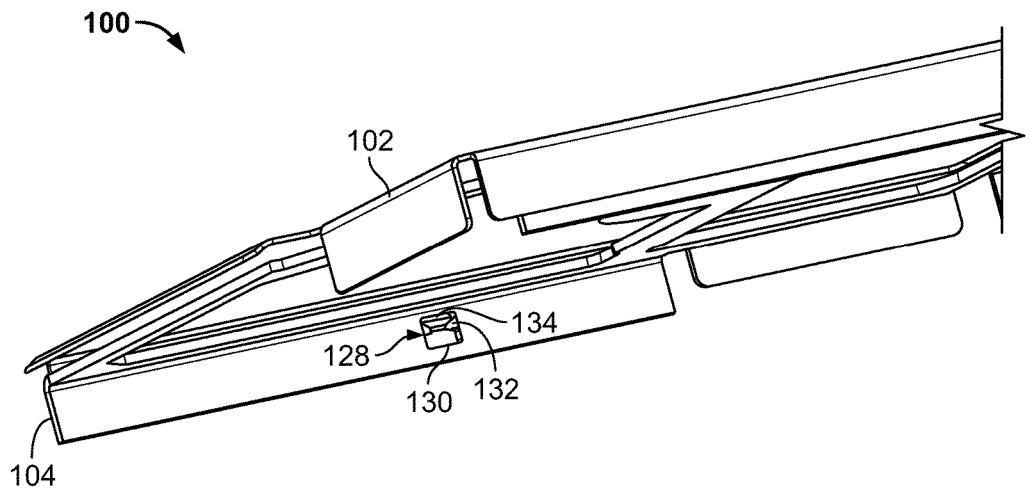
Figure 10:
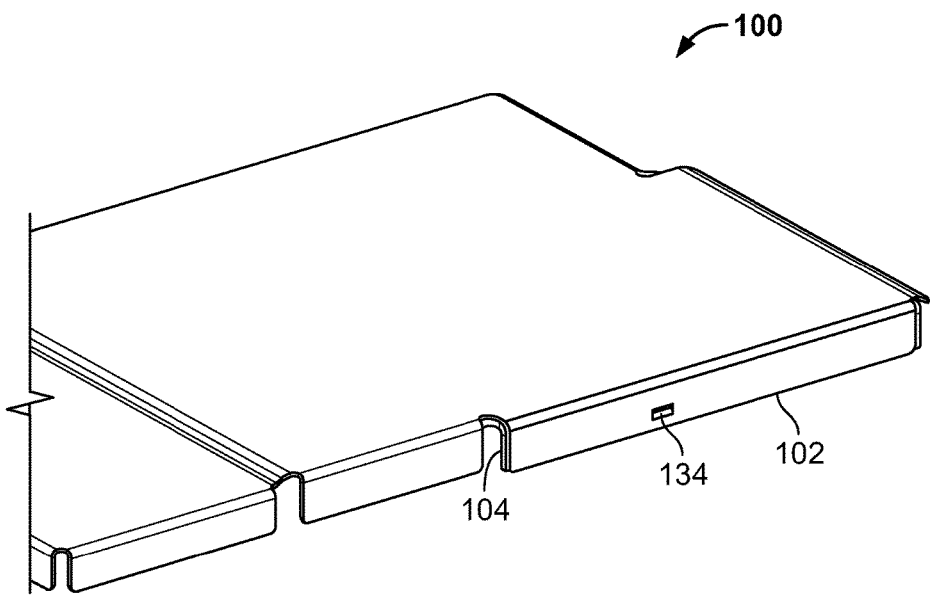
FIGS. 10 and 11 are respective outer and inner perspective views of the portions of the shield shown in FIGS. 8 and 9, respectively, where the lid is shown in the second or lowered position relative to the fence.
Figure 11:
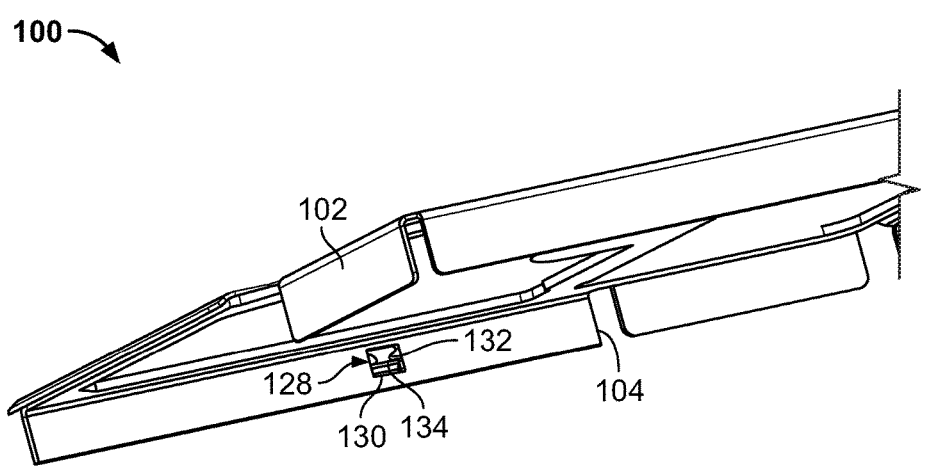

FIGS. 8 and 9 are respective outer and inner perspective views of portions of the shield 100 with the lid 102 shown in the first or raised position relative to the fence 104. FIGS. 10 and 11 are respective outer and inner perspective views of portions of the shield 100 with the lid 102 shown in the second or lowered position relative to the fence 104. FIG. 12 is a perspective view of the fence 104 and showing the window or opening 130 in the fence 104.

The disclosure also embraces methods of installing two-piece board level shields. In an exemplary embodiment, a method generally includes providing a metallic board level shield that includes a complementary fence and lid, where the lid and fence are engaged via a series of locking mechanisms in a first position. In this first position, the fence may be soldered to a printed circuit board, where the shield, in being so soldered, provides a substantially complete cover for at least one electronic component mounted on the PCB. The lid may include an interface material (e.g., a thermal interface material, etc.) on the underside of the lid. After the shield has been soldered to the PCB while in the first position and the solder has hardened, the shield may be compressed into a second position by providing or applying downward force on the top of the lid in the direction towards the PCB. The series of locking mechanisms, upon the application of the downward force, move to a second position and further prevent or inhibit the free movement of the shield back into the uncompressed first position. The interface material on the underside of the lid may snugly engage (e.g., compressively conform against, etc.) one or more electronic components on the PCB, so as to provide at least some upward force on the underside of the lid, in the opposite direction of the aforementioned downward force. The locking mechanisms, in the presence of this upward force, maintain the shield in the compressed and locked second position.

In an exemplary embodiment, a method generally includes attaching a lid of a shield to a fence of the shield in a first position such that at least one detent of the lid is engaged within an upper portion of at least one opening of the fence above one or more tabs of the fence and such that a spaced distance separates an underside of the lid from an upper surface of the fence. The method also includes moving the lid relatively towards the fence from the first position to a second position in which the at least one detent is engaged within a lower portion of the at least one opening below the one or more tabs and the spaced distance is substantially eliminated between the underside of the lid and the upper surface of the fence.

The method may further include soldering a bottom of the fence to an upper surface of a printed circuit board when the lid is attached to the fence in the first position, and then after soldering, moving the lid relatively towards the fence from the first position to the second position.

Moving the lid relatively towards the fence from the first position to the second position may include moving an interface material along the underside of the lid from the first position in which a spaced distance separates the interface material from at least one component on the printed circuit board to the second position in which the spaced distance is substantially eliminated between the interface material and the at least one component.

Moving the lid relatively towards the fence from the first position to the second position may include compressing an interface material along the underside of the lid against at least one component on the printed circuit board, which results in an upward force that pushes the lid away from the fence. The engagement of the at least one detent within the lower portion of the at least one opening below the one or more tabs may hold the lid in place on the fence in the second position despite the upward force.

The interface material may comprise one or more of a thermal interface material, an EMI absorber, a thermally-conductive EMI absorber, an EMI shielding material, and/or a thermally-conductive electrical insulator.

Moving the lid relatively towards the fence from the first position to the second position may include sliding the at least one detent along the one or more tabs such that the at least one detent moves outwardly from the upper portion of the at least one opening, across and below the one or more tabs, and into the lower portion of the at least one opening below the one or more tabs.

Attaching the lid to the fence in the first position may include contacting a lower surface of the at least one detent with an upper surface of the one or more tabs, which inhibits downward movement of the lid relative to the fence such that the underside of the lid remains above and spaced apart from the upper surface of the fence. Moving the lid relatively towards the fence from the first position to the second position may include contacting an upper surface of the at least one detent with a lower surface of the one or more tabs, which inhibits upward movement of the lid relative to the fence such that the lid is not removable from the fence without deforming the lid to disengage the at least one detent from the one or more tabs.

By way of example only, exemplary embodiments disclosed herein may include a frame or fence having corner sections with drawn portions that are similar or identical to the frames with corner sections having drawn portions (and/or made by a same or similar manufacturing processes) as disclosed in U.S. Pat. No. 7,488,902. The entire disclosure of U.S. Pat. No. 7,488,902 is incorporated herein by reference.

Additionally, by way of example only, exemplary embodiments disclosed herein may include a cover, frame, and/or thermal interface material similar or identical to a frame, cover and/or thermal interface material (and/or made by a same or similar manufacturing process) as disclosed in U.S. Pat. No. 7,623,360. The entire disclosure of U.S. Pat. No. 7,623,360 is incorporated herein by reference.

The fence or frame and cover or lid may both be generally rectangular. Alternative embodiments can include a fence/frame and/or a lid/cover having more or less than four peripheral walls and/or peripheral walls in other rectangular configurations or non-rectangular configurations (e.g., triangular, hexagonal, circular, other polygonal shapes, other rectangular configurations than what is shown the in figures, etc.). Further embodiments can include peripheral walls having more or less openings and/or more or less detents than what are disclosed in the figures. Other embodiments may include a fence that includes a single sidewall or a plurality of separate, discrete sidewalls that are individually soldered to the PCB.

In various embodiments, the fence or frame may be integrally or monolithically formed as a single component. The fence or frame can be formed by stamping a flat profile pattern for the frame in a piece of material. After stamping the flat pattern profile for the fence into the piece of material, the wall portions may then be folded or bent generally perpendicular. Even though the fence may be formed integrally in this example, such is not required for all embodiments. For example, other embodiments of the fence may include tabs or wall portions that are discrete components separately attached to the frame, for example, by welding, adhesives, among other suitable methods. Alternative configurations (e.g., shapes, sizes, etc.), materials, and manufacturing methods (e.g., drawing, etc.) can be used for making the fence.

A wide range of materials can be used for the fence or frame, which are preferably suitably solderable for surface mount technology reflow operations. Exemplary materials that can be used for the fence include nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials. The assembly and components thereof can be configured from different materials and/or with different dimensions depending, for example, on the particular application, such as the component to be shielded, space considerations within the overall apparatus, EMI shielding and heat dissipation needs, and other factors.

The lid or cover may be integrally or monolithically formed as a single component. The lid can be formed by stamping in a piece of material in a flat profile pattern for the lid. After stamping the flat pattern profile for the lid into the piece of material, the wall portions may then be folded or bent generally perpendicular. Even though the lid can be formed integrally in this example, such is not required for all embodiments. For example, other embodiments may include one or more discrete components separately attached to the lid, for example, by welding, adhesives, among other suitable methods. Alternative configurations (e.g., shapes, sizes, etc.), materials, and manufacturing methods (e.g., drawing, etc.) can be used for making the lid.

A wide range of materials can be used for the lid or cover, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials. The assembly and components thereof can be configured from different materials and/or with different dimensions depending, for example, on the particular application, such as the component to be shielded, space considerations within the overall apparatus, EMI shielding and heat dissipation needs, and other factors.

In exemplary embodiments, the shield may have partially drawn and partially formed corner sections for improved rigidity. In an exemplary embodiment, the shield generally includes side walls configured to be disposed generally about one or more electrical components on a substrate. Corner sections are integrally formed with the side walls. Each corner section has a drawn portion integrally connecting a corresponding pair of side walls, and a lower portion located generally below the drawn portion and generally between side edge portions of the corresponding pair of side walls.

In an exemplary embodiment, the shield generally includes an upper surface and side walls integrally formed with and downwardly depending from the upper surface. The side walls are configured to be disposed generally about one or more electrical components on a substrate. The side walls have side edges that are each configured for interlocking engagement with a side edge of a corresponding adjacent side wall. Corner sections are integrally formed with the side walls and the upper surface. Each corner section includes a drawn portion integrally connecting a corresponding pair of side walls and the upper surface. The drawn portion downwardly depends relative to the upper surface. Each corner section also includes a lower portion located generally below the drawn portion. The lower portions include seams formed by the interlocking engagement of the side edges of the corresponding pair of side walls. For each corner section, there is also an opening cooperatively defined by the drawn portion and the lower portion of the corner section.

In other exemplary embodiments, there are methods of using and/or methods of making electromagnetic interference shields having side walls and a corner section generally between each corresponding pair of side walls. In an exemplary embodiment, a method generally includes drawing a piece of material to form a drawn portion for each corner section that integrally connects a corresponding pair of side walls. This particular method also includes forming the piece of material such that the side walls are configured to be disposed generally about one or more electrical components on a substrate, and such that each corner section includes a lower portion located generally below the drawn portion and generally between side edge portions of the corresponding pair of side walls.

Example embodiments of the BLS (e.g., BLS 100 (FIGS. 1-12), etc.) disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), application processor (AP), AP chip, multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

A wide range of thermal interface materials may be used in exemplary embodiments for the interface material (e.g., 110 (FIGS. 1 and 2), etc.), which preferably are better thermal conductors and have higher thermal conductivities than air alone. Accordingly, the thermal interface material (with its compressive contact against an electrical component) may thus allow for improved heat transfer from the electrical component to the lid or cover as compared to those designs relying solely upon air to define the heat path between the electrical component and the underside of the lid.

Example thermal interface materials include thermal gap fillers, thermal phase change materials, thermally-conductive EMI absorbers or hybrid thermal/EMI absorbers, thermal greases, thermal pastes, thermal putties, dispensable thermal interface materials, thermal pads, etc. Example embodiments may include one or more thermal interface materials of Laird, such as any one or more of the Tputty™ series thermal gap fillers (e.g., Tputty™ 403, 504, 506, or 508 dispensable thermal interface materials, etc.), Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 or 780 series phase change materials, etc.), Tpli™ series gap fillers (e.g., Tpli™ 200 series gap fillers, etc.), IceKap™ series thermal interface materials, CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), Tgrease™ 880 series thermal greases, etc.

In exemplary embodiments, a dispensable thermal interface material may be dispensed along the underside of the lid or cover, such as one or more of the following Laird dispensable thermal interface materials, e.g., Tflex™ CR200, Tputty™ 403, Tputty™ 504, and/or Tputty™ 506 dispensable thermal gap fillers, etc. Additionally, or alternatively, a compliant gap filler having high thermal conductivity may be dispensed along the underside of the lid or cover, such as one or more of the following Laird gap fillers, e.g., Tflex™ 200, Tflex™ HR200, Tflex™ 300, Tflex™ 300 TG, Tflex™ HR400, Tflex™ 500, Tflex™ 600, Tflex™ HR600, Tflex™ SF600, Tflex™ 700, and/or Tflex™ SF800 thermal gap fillers, etc.

The tables below list example TIMs and properties. These example TIMs are from Laird Technologies, and, accordingly, have been identified by reference to trademarks of Laird Technologies. These tables are provided for purposes of illustration only and not for purposes of limitation.

| Name | Construction Composition | Type | Thermal Conductivity [W/mK] | Thermal Impedance [° C.-cm$^2$/W] | Pressure of Thermal Impedance Measurement [kPa] |
|---|---|---|---|---|---|
| Tflex ™ 620 | Reinforced boron nitride filled silicone elastomer | Gap Filler | 3.0 | 2.97 | 69 |
| Tflex ™ 640 | Boron nitride filled silicone elastomer | Gap Filler | 3.0 | 4.0 | 69 |

-continued

| Name | Construction Composition | Type | Thermal Conductivity [W/mK] | Thermal Impedance [° C.-cm²/W] | Pressure of Thermal Impedance Measurement [kPa] |
|---|---|---|---|---|---|
| Tflex ™ 660 | Boron nitride filled silicone elastomer | Gap Filler | 3.0 | 8.80 | 69 |
| Tflex ™ 680 | Boron nitride filled silicone elastomer | Gap Filler | 3.0 | 7.04 | 69 |
| Tflex ™ 6100 | Boron nitride filled silicone elastomer | Gap Filler | 3.0 | 7.94 | 69 |
| Tpli ™ 210 | Boron nitride filled, silicone elastomer, fiberglass reinforced | Gap Filler | 6 | 1.03 | 138 |
| Tpcm ™ 583 | Non-reinforced film | Phase Change | 3.8 | 0.12 | 69 |
| Tflex ™ 320 | Ceramic filled silicone elastomer | Gap Filler | 1.2 | 8.42 | 69 |
| Tgrease ™ 880 | Silicone-based based grease | Thermal Grease | 3.1 | 0.138 | 348 |

| | Tflex ™ 620 | Tflex ™ 640 | Tflex ™ 660 | Tflex ™ 680 | Tflex ™ 6100 | Test Method |
|---|---|---|---|---|---|---|
| Construction & Composition | Reinforced boron nitride filled silicone elastomer | Boron nitride filled silicone elastomer | Boron nitride filled silicone elastomer | Boron nitride filled silicone elastomer | Boron nitride filled silicone elastomer | |
| Color | Blue-Violet | Blue-Violet | Blue-Violet | Blue-Violet | Blue-Violet | Visual |
| Thickness | 0.020" (0.51 mm) | 0.040" (1.02 mm) | 0.060" (1.52 mm) | 0.080" (2.03 mm) | 0.100" (2.54 mm) | |
| Thickness Tolerance | ±0.003" (±0.08 mm) | ±0.004" (±0.10 mm) | ±0.006" (±0.15 mm) | ±0.008" (±0.20 mm) | ±0.010" (±0.25 mm) | |
| Density | 1.38 g/cc | 1.34 g/cc | 1.34 g/cc | 1.34 g/cc | 1.34 g/cc | Helium Pycnometer |
| Hardness | 40 shore 00 | 25 shore 00 | 25 shore 00 | 25 shore 00 | 25 shore 00 | ASTM D2240 |
| Tensile Strength | N/A | 15 psi | 15 psi | 15 psi | 15 psi | ASTM D412 |
| % Elongation | N/A | 75 | 75 | 75 | 75 | ASTM D412 |
| Outgassing TML (Post Cured) | 0.13% | 0.13% | 0.13% | 0.13% | 0.13% | ASTM E595 |
| Outgassing CVCM (Post Cured) | 0.05% | 0.05% | 0.05% | 0.05% | 0.05% | ASTM E595 |
| UL Flammability Rating | UL 94 V0 | UL 94 V0 | UL 94 V0 | UL 94 V0 | UL 94 V0 | E180840 |
| Temperature Range | −45° C. to 200° C. | −45° C. to 200° C. | −45° C. to 200° C. | −45° C. to 200° C. | −45° C. to 200° C. | ASTM D5470 (modified) |
| Thermal Conductivity | 3 W/mK | 3 W/mK | 3 W/mK | 3 W/mK | 3 W/mK | |
| Thermal Impedance | | | | | | ASTM D5470 (modified) |
| @ 10 psi | 0.46° C.-in²/W | 0.62° C.-in²/W | 0.85° C.-in²/W | 1.09° C.-in²/W | 1.23° C.-in²/W | |
| @ 69 KPa | 2.97° C. cm²/W | 4.00° C. cm²/W | 5.50° C. cm²/W | 7.04° C. cm²/W | 7.94° C. cm²/W | |

-continued

|  | Tflex ™ 620 | Tflex ™ 640 | Tflex ™ 660 | Tflex ™ 680 | Tflex ™ 6100 | Test Method |
|---|---|---|---|---|---|---|
| Thermal Expansion | 600 ppm/° C. | 430 ppm/° C. | 430 ppm/° C. | 430 ppm/° C. | 430 ppm/° C. | IPC-TM-650 2.4.24 |
| Breakdown Voltage | 3,000 Volts AC | >5,000 Volts AC | >5,000 Volts AC | >5,000 Volts AC | >5,000 Volts AC | ASTM D149 |
| Volume Resistivity | $2 \times 10^{13}$ ohm-cm | $2 \times 10^{13}$ ohm-cm | $2 \times 10^{13}$ ohm-cm | $2 \times 10^{13}$ ohm-cm | $2 \times 10^{13}$ ohm-cm | ASTM D257 |
| Dielectric Constant @ 1 MHz | 3.31 | 3.31 | 3.31 | 3.31 | 3.31 | ASTM D150 |

| PROPERTIES | |
|---|---|
| Color | Grey |
| Density | 2.73 g/cc |
| Viscosity Brookfield Viscometer | <1,500,000 cps TF spindle at 2 rpm (helipath) and 23° C. |
| Temperature Range | −40-150° C. (−40-302° F.) |
| UL Flammability Rating | 94 VO File E-180840 |
| Thermal Conductivity | 3.1 W/mK |
| Thermal Resistance | |
| @ 10 psi | 0.014° C.-in$^2$/W (0.090° C.-cm$^2$/W) |
| @ 20 psi | 0.010° C.-in$^2$/W (0.065° C.-cm$^2$/W) |
| @ 50 psi | 0.009° C.-in$^2$/W (0.058° C.-cm$^2$/W) |
| Volume Resistivity (ASTM D257) | $9 \times 10^{13}$ Ohm-cm |

| Typical Property | Description | Test Method |
|---|---|---|
| Color | Grey | Visual |
| Construction/Composition | Non-reinforced film | |
| Specific Gravity, g/cc | 2.51 | Helium Pycnometer |
| Minimum bond line thickness, mm (mils) | 0.025 (1) | Laird Test Method |
| Thermal conductivity, W/mK | 4.7 | Hot Disk Thermal Constants Analyzer |
| Thermal Resistance, ° C. cm$^2$/W (° C. in$^2$/W) | 0.064 (0.010) | ASTM D5470 |
| Available Thickness, mm (mils) | 0.125-0.625 (5-25) | Laird Test Method |
| Room Temperature Hardness, shore 00 | 85 | ASTM D2240 |
| Volume Resistivity, ohm-cm | $10^{15}$ | ASTM D257 |

Specifications

| PROPERTIES | Tpcm ™ 583 | Tpcm ™ 585 | Tpcm ™ 588 | Tpcm ™ 5810 |
|---|---|---|---|---|
| Construction & composition | Non-reinforced film | | | |
| Color | Gray | | | |
| Thickness | 0.003" (0.076 mm) | 0.005" (0.127 mm) | 0.008" (0.2 mm) | 0.010" (0.25 mm) |
| Density | 2.87 g/cc | | | |
| Operating temperature range | −40° C. to 125° C. (−40° C. to 257° F.) | | | |
| Phase change softening temperature | 50° C. (122° F.) | | | |
| Thermal resistance | | | | |
| 10 psi | 0.019° C.-in$^2$/W (0.12° C.-cm$^2$/W) | 0.020° C.-in$^2$/W (0.13° C.-cm$^2$/W) | 0.020° C.-in$^2$/W (0.13° C.-cm$^2$/W) | 0.020° C.-in$^2$/W (0.13° C.-cm$^2$/W) |
| 20 psi | 0.016° C.-in$^2$/W (0.10° C.-cm$^2$/W) | 0.016° C.-in$^2$/W (0.10° C.-cm$^2$/W) | 0.016° C.-in$^2$/W (0.10° C.-cm$^2$/W) | 0.016° C.-in$^2$/W (0.10° C.-cm$^2$/W) |
| 50 psi | 0.013° C.-in$^2$/W (0.08° C.-cm$^2$/W) | 0.013° C.-in$^2$/W (0.08° C.-cm$^2$/W) | 0.013° C.-in$^2$/W (0.08° C.-cm$^2$/W) | 0.013° C.-in$^2$/W (0.08° C.-cm$^2$/W) |
| Thermal conductivity | 3.8 W/mK | | | |
| Volume resistivity | $3.0 \times 10^{12}$ ohm-cm | | | |

| PROPERTIES | Tpcm™ 780 | TEST METHOD |
|---|---|---|
| Color | Grey | Visual |
| Thickness, inches (mm) | 0.016" (0.406) 0.025" (0.635) | |
| Thickness Tolerance, inches (mm) | ±0.0016" (0.0406) ±0.0025 (0.0635) | |
| Construction & Composition | Non-reinforced Film | |
| Specific Gravity, g/cc | 2.48 | Helium Pycnometer |
| Phase Change Softening Range, ° C. | ~45° C. to 70° C. | |
| Thermal Conductivity, W/mK | 5.4 | Hot Disk Thermal Constants Analyzer |
| Hardness (shore 00) | 85 3 sec @ 21 C. | ASTM D2240 |
| Thermal Resistance | | |
| 70° C., 345 kPa, ° C.-cm²/W (50 psi, ° C.-in²/W) | 0.025 (0.004) | ASTM D5470 (modified) |
| Outgassing TML | 0.51% | ASTM E595 |
| Outgassing CVCM | 0.20% | ASTM E595 |

Tflex™ 300 Typical Properties

| | TFLEX™ 300 | TEST METHOD |
|---|---|---|
| Construction | Filled silicone elastomer | NA |
| Color | Light green | Visual |
| Thermal Conductivity | 1.2 W/mK | ASTM D5470 |
| Hardness (Shore 00) | 27 (at 3 second delay) | ASTM D2240 |
| Density | 1.78 g/cc | Helium Pyncometer |
| Thickness Range | 0.020"-.200" (0.5-5.0 mm)* | |
| Thickness Tolerance | ±10% | |
| UL Flammability Rating | 94 V0 | UL |
| Temperature Range | −40° C. to 160° C. | NA |
| Volume Resistivity | 10^13 ohm-cm | ASTEM D257 |
| Outgassing TML | 0.56% | ASTM E595 |
| Outgassing CVCM | 0.10% | ASTM E595 |
| Coefficient Thermal Expansion (CTE) | 600 ppm/C. | IPC-TM-650 2.4.24 |

The tables herein list various TIMs that have thermal conductivities of 1.2, 3, 3.1, 3.8, 4.7, 5.4, and 6 W/mK. These thermal conductivities are only examples as other embodiments may include a TIM with a thermal conductivity higher than 6 W/mK, less than 1.2 W/mK, or other values

| | TPLI™ 210 | TPLI™ 220 | TPLI™ 240 | TPLI™ 260 | TPLI™ 2100 | TEST METHOD |
|---|---|---|---|---|---|---|
| Construction & Composition | Reinforced boron nitride filled silicone elastomer | Boron nitride filled silicone elastomer | Boron nitride filled silicone elastomer | Boron nitride filled silicone elastomer | Boron nitride filled silicone elastomer | |
| Color | Rose | Blue | Yellow | Grey | Grey | Visual |
| Thickness | 0.010" (0.25 mm) | 0.020" (0.51 mm) | 0.040" (1.02 mm) | 0.060" (1.52 mm) | 0.100" (2.54 mm) | |
| Thickness Tolerance | ±0.001" (±0.025 mm) | ±0.002" (±0.05 mm) | ±0.003" (±0.08 mm) | ±0.004" (±0.10 mm) | ±0.007" (±0.18 mm) | |
| Density | 1.44 g/cc | 1.43 g/cc | 1.43 g/cc | 1.38 g/cc | 1.36 g/cc | Helium Pycnometer |
| Hardness | 75 Shore 00 | 70 Shore 00 | 70 Shore 00 | 70 Shore 00 | 70 Shore 00 | ASTM D2240 |
| Tensile Strength | N/A | 35 psi | 35 psi | 20 psi | 15 psi | ASTM D412 |
| % Elongation | N/A | 5 | 5 | 5 | 5 | ASTM D412 |
| Outgassing TML (Post Cured) | 0.08% | 0.07% | 0.07% | 0.10% | 0.15% | ASTM E595 |
| Outgassing CVCM (Post Cured) | 0.03% | 0.02% | 0.02% | 0.04% | 0.07% | ASTM E595 |
| UL Flammability Rating | 94 HB | 94 HB | 94 HB | 94 HB | 94 HB | E180840 |
| Temperature Range | −45° C. to 200° C. | −45° C. to 200° C. | −45° C. to 200° C. | −45° C. to 200° C. | −45° C. to 200° C. | |
| Thermal Conductivity | 6 W/mK | 6 W/mK | 6 W/mK | 6 W/mK | 6 W/mK | ASTM D5470 (modified) |
| Thermal Impedance @ 20 psi @ 138 KPa | 0.16° C. in²/W 1.03° C. cm²/W | 0.21° C. in²/W 1.35° C. cm²/W | 0.37° C. in²/W 2.45° C. cm²/W | 0.49° C. in²/W 3.35° C. cm²/W | 0.84° C. in²/W 5.81° C. cm²/W | ASTM D5470 (modified) |
| Thermal Expansion | 51 ppm/C. | 123 ppm/C. | 72 ppm/C. | 72 ppm/C. | 96 ppm/C. | IPC-TM-650 2.4.24 |
| Breakdown Voltage | 1,000 Volts AC | 4,000 Volts AC | >5,000 Volts AC | >5,000 Volts AC | >5,000 Volts AC | ASTM D149 |
| Volume Resistivity | 5 × 10¹³ ohm-cm | 5 × 10¹³ ohm-cm | 5 × 10¹³ ohm-cm | 5 × 10¹³ ohm-cm | 5 × 10¹³ ohm-cm | ASTM D257 |
| Dielectric Constant @ 1 MHz | 3.21 | 3.21 | 3.26 | 3.26 | 3.4 | ASTM D150 | between 1.2 and 6 W/mk. For example, a TIM may be used that has a thermal conductivity higher than air's thermal conductivity of 0.024 W/mK, such as a thermal conductivity of about 0.3 W/mk, of about 3.0 W/mK, or somewhere between 0.3 W/mk and 3.0 W/mk, etc.

In addition to the examples listed in the tables above, other thermally-conductive compliant materials or thermally-conductive interface materials can also be used for a TIM. For example, a TIM may include compressed particles of exfoliated graphite, formed from intercalating and exfoliating graphite flakes, such as eGraf™ commercially available from Advanced Energy Technology Inc. of Lakewood, Ohio. Such intercalating and exfoliating graphite may be processed to form a flexible graphite sheet, which may include an adhesive layer thereon. A TIM may comprise one or more of the thermal interface materials (e.g., graphite, flexible graphite sheet, exfoliated graphite, etc.) disclosed in U.S. Pat. No. 6,482,520, U.S. Pat. No. 6,503,626, U.S. Pat. No. 6,841,250, U.S. Pat. No. 7,138,029, U.S. Pat. No. 7,150,914, U.S. Pat. No. 7,160,619, U.S. Pat. No. 7,267,273, U.S. Pat. No. 7,303,820, U.S. Patent Application Publication 2007/0042188, and/or U.S. Patent Application Publication 2007/0077434.

A TIM may comprise a pad of self-healing, thermoplastic, and/or phase change material having a softening point (e.g., a melting temperature, phase change temperature, etc.) that is higher than, less than, or within a normal operating temperature range of a heat source (e.g., CPU having a normal operating temperature range from about 60° C. to 100° C., etc.). A TIM may comprise a thermal interface material including a thermally reversible gel as disclosed hereinafter and in U.S. Patent Application Publication No. US 2011/0204280, the entire disclosure of which is incorporated herein by reference in its entirety. A TIM may comprise a cross-linked material having self-healing properties, a material that is not cross-linkable and has self-healing properties, a viscous liquid having self-healing properties, a cured material having self-healing properties, etc.

A TIM may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives, etc. A TIM may be configured to have sufficient conformability, compliability, and/or softness to allow the TIM material to closely conform to a mating surface when placed in contact with the mating surface, including a non-flat, curved, or uneven mating surface. A TIM may comprise an electrically conductive soft thermal interface material formed from elastomer and at least one thermally-conductive metal, boron nitride, and/or ceramic filler, such that the soft thermal interface material is conformable even without undergoing a phase change or reflow. A TIM may comprise a thermal interface phase change material, such as the Tpcm™ 583 listed in the above table.

A TIM may comprise one or more conformable thermal interface material gap filler pads having sufficient deformability, compliance, conformability, compressibility, and/or flexibility for allowing a pad to relatively closely conform to the size and outer shape of an electronic component when placed in contact with the electronic component when the shielding apparatus is installed to a printed circuit board over the electronic component. By engaging an electronic component in a relatively close fitting and encapsulating manner, a conformable thermal interface material gap pad may conduct heat away from the electronic component to the cover in dissipating thermal energy. Also, the thermal interface material gap filler pad may be a non-phase change material and/or be configured to adjust for tolerance or gap by deflecting. Such a thermal interface material gap filler pad would not be considered to be a spreadable paste.

The TIM may be a non-metal, non-phase change material that does not include metal and that is conformable even without undergoing a phase change or reflow. A TIM may comprise a thermal interface phase change material.

A TIM may comprise one or more conformable thermal interface material gap filler pads having sufficient deformability, compliance, conformability, compressibility, flowability, and/or flexibility for allowing a pad to relatively closely conform (e.g., in a relatively close fitting and encapsulating manner, etc.) to the size and outer shape of another component. Also, the thermal interface material gap filler pad may be a non-phase change material and/or be configured to adjust for tolerance or gap by deflecting.

In some exemplary embodiments, the thermal interface material may comprise a non-phase change gap filler, gap pad, or putty that is conformable without having to melt or undergo a phase change. The thermal interface material may be able to adjust for tolerance or gaps by deflecting at low temperatures (e.g., room temperature of 20° C. to 25° C., etc.). The thermal interface material may have a Young's modulus and Hardness Shore value considerably lower than copper or aluminum. The thermal interface material may also have a greater percent deflection versus pressure than copper or aluminum.

In some exemplary embodiments, the thermal interface material comprises Tflex™ 300 ceramic filled silicone elastomer gap filler or Tflex™ 600 boron nitride filled silicone elastomer gap filler, which both have a Young's modulus of about 0.000689 gigapascals. Accordingly, exemplary embodiments may include thermal interface materials having a Young's module much less than 1 gigapascal. Tflex™ 300 ceramic filled silicone elastomer gap filler and Tflex™ 600 boron nitride filled silicone elastomer gap filler have a Shore 00 hardness value (per the ASTMD2240 test method) of about 27 and 25, respectively. In some other exemplary embodiments, the thermal interface material may comprise Tpli™ 200 boron nitride filled, silicone elastomer, fiberglass reinforced gap filler having a Shore 00 hardness of about 70 or 75. Accordingly, exemplary embodiments may include thermal interface materials having a Shore 00 hardness less than 100. Tflex™ 300 series thermal gap filler materials generally include, e.g., ceramic, filled silicone elastomer which will deflect to over 50% at pressures of 50 pounds per square inch and other properties shown below. Tflex™ 600 series thermal gap filler materials generally include boron nitride filled silicone elastomer, which recover to over 90% of their original thickness after compression under low pressure (e.g., 10 to 100 pounds per square inch, etc.), have a hardness of 25 Shore 00 or 40 Shore 00 per ASTM D2240. Tpli™ 200 series gap fillers generally include reinforced boron nitride filled silicone elastomer, have a hardness of 75 Shore 00 or 70 Shore 00 per ASTM D2240. Tpcm™ 580 series phase change materials are generally non-reinforced films having a phase change softening temperature of about 122 degrees Fahrenheit (50 degrees Celsius). Tgrease™ 880 series thermal grease is generally a silicone-based thermal grease having a viscosity of less than 1,500,000 centipoises. Other exemplary embodiments may include a TIM with a hardness of less 25 Shore 00, greater than 75 Shore 00, between 25 and 75 Shore 00, etc.

In some exemplary embodiments, multiple different thermal interface materials may be disposed along the underside of the lid. The multiple different thermal interface materials may have different thicknesses to accommodate for varying heights of the electronic components, heat sources, etc., that will be under the lid.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "have," "has," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed:

1. A shield suitable for use in providing electromagnetic interference (EMI) shielding for at least one component on a substrate, the shield comprising:
   a fence configured for installation to the substrate about the at least one component on the substrate, the fence including at least one opening having an upper portion, a lower portion, and one or more tabs inwardly extending from one or more sides of the at least opening between the upper and lower portions of the at least one opening;
   a lid including at least one detent positionable within the at least one opening of the fence such that the lid is attachable to the fence in multiple positions including:
      a first position in which the at least one detent is engaged within the upper portion of the at least one opening above the one or more tabs and the one or more tabs are disposed under and in contact with the at least one detent such that the lid is held in a raised position relative to the fence and a spaced distance separates an underside of the lid from an upper surface of the fence; and
      a second position in which the at least one detent is within the lower portion of the at least one opening below the one or more tabs and the one or more tabs are disposed above and in contact with the at least one detent such that the lid is held in a lowered position relative to the fence and the spaced distance is substantially eliminated between the underside of the lid and the upper surface of the fence.

2. The shield of claim 1, further comprising an interface material along the underside of the lid such that when the fence is installed to the substrate about the at least one component on the substrate:
   a spaced distance separates the interface material from the at least one component when the lid is attached to the fence in the first position; and
   the spaced distance is substantially eliminated between the interface material and the at least one component when the lid is attached to the fence in the second position;
   wherein the interface material comprises one or more of a thermal interface material, an EMI absorber, a thermally-conductive EMI absorber, an EMI shielding material, and/or a thermally-conductive electrical insulator.

3. The shield of claim 2, wherein:
   the interface material is compressed against the at least one component when the lid is attached to the fence in the second position; and
   the interface material is pushed down against the at least one component when the lid is attached to the fence in the second position, which results in an upward force that pushes the lid away from the fence, and the engagement of the at least one detent with the lower portion of the at least one opening and the contact between the at least one detent and the one or more tabs holds the lid in place on the fence in the second position despite the upward force.

4. The shield of claim 1, further comprising a thermal interface material along the underside of the lid such that when the fence is installed to the substrate about the at least one component on the substrate:
   a spaced distance separates the thermal interface material from the at least one component when the lid is attached to the fence in the first position; and
   the thermal interface material is compressed against the at least one component when the lid is attached to the fence in the second position, and the thermal interface material defines at least a portion of a thermally-conductive heat path from the at least one component to the lid.

5. The shield of claim 1, wherein:
   contact between a lower surface of the at least one detent and an upper surface of the one or more tabs in the first position inhibits downward movement of the lid relative to the fence such that the underside of the lid remains above and spaced apart from the upper surface of the fence; and
   contact between an upper surface of the at least one detent and a lower surface of the one or more tabs in the second position inhibits upward movement of the lid relative to the fence such that the lid is not removable from the fence without deforming the lid to disengage the at least one detent from the one or more tabs.

6. The shield of claim 1, wherein
   the one or more tabs comprise a pair of tabs that extend towards each other from opposite sides of the at least one opening and that are bent outwardly relative to an interior of the shield.

7. The shield of claim 1, wherein:
   the at least one detent is configured to contact and slide along the one or more tabs when the lid is moved from the first position to the second position; and
   sliding contact of the at least one detent with the one or more tabs causes the at least one detent to move outwardly from the upper portion of the at least one opening, across and below the one or more tabs, and into the lower portion of the at least one opening below the one or more tabs.

8. The shield of claim 1, wherein:
   the at least one detent is resilient such that after being moved past the one or more tabs and into alignment with the lower portion of the at least one opening, the at least one detent resiliently moves inwardly into the lower portion of the at least one opening under the one or more tabs; and
   the one or more tabs comprise a pair of tabs that extend towards each other from opposite sides of the at least one opening; and
   the pair of tabs and the upper and lower portions of the at least one opening cooperatively define a generally hourglass closed shape for the at least one opening.

9. The shield of claim 1, wherein:
   the shield is a two-piece board level shield including the lid and the fence;
   the substrate is a printed circuit board;
   a bottom of the fence is solderable to an upper surface of the printed circuit board when the lid is in the first position in which a base of the lid is separated and spaced apart from the upper surface of the printed circuit board; and
   the lid is movable into the second position after the bottom of the fence is soldered to the upper surface of the printed circuit board, whereby the lid and the fence are operable for providing EMI shielding for the at least one component on the printed circuit board that are within an interior cooperatively defined by the lid and the fence.

10. An electronic device comprising the shield of claim 1 and the substrate, the substrate is a printed circuit board including the at least one component thereon, wherein:

a bottom of the fence is soldered to an upper surface of the printed circuit board; and the lid is movable from the first position to the second position in which the lid and the fence are operable for providing EMI shielding for the at least one component on the printed circuit board that are within an interior cooperatively defined by the lid and the fence.

11. A shield suitable for use in providing electromagnetic interference (EMI) shielding for at least one component on a substrate, the shield comprising:
  a fence configured for installation to the substrate about the at least one component on the substrate, the fence including at least one opening;
  a lid including at least one detent positionable within different upper and lower portions of the same at least one opening of the fence such that the lid is positionable on the fence in multiple positions including:
    a first position in which the at least one detent is engaged within the upper portion of the at least one opening and a spaced distance separates an underside of the lid from an upper surface of the fence; and
    a second position in which the at least one detent is engaged within the lower portion of the at least one opening and the spaced distance is substantially eliminated between the underside of the lid and the upper surface of the fence.

12. The shield of claim 11, wherein:
  the at least one opening of the fence includes one or more tabs inwardly extending from one or more sides of the at least opening, the upper portion is above the one or more tabs, and the lower portion is below the one or more tabs;
  the at least one detent of the lid is engaged within the upper portion of the at least one opening above the one or more tabs that are disposed under and in contact with the at least one detent such that the lid is held in a raised position relative to the fence when the lid is positioned on the fence in the first position; and
  the at least one detent of the lid is engaged within the lower portion of the at least one opening below the one or more tabs that are disposed above and in contact with the at least one detent such that the lid is held in a lowered position relative to the fence when the lid is positioned on the fence in the second position.

13. The shield of claim 11, further comprising an interface material along the underside of the lid such that when the fence is installed to the substrate about the at least one component on the substrate:
  a spaced distance separates the interface material from the at least one component when the lid is positioned on the fence in the first position; and
  the spaced distance is substantially eliminated between the interface material and the at least one component when the lid is positioned on the fence in the second position;
  wherein the interface material comprises one or more of a thermal interface material, an EMI absorber, a thermally-conductive EMI absorber, an EMI shielding material, and/or a thermally-conductive electrical insulator.

14. The shield of claim 13, wherein:
  the interface material is compressed against the at least one component when the lid is positioned on the fence in the second position; and
  the interface material is pushed down against the at least one component when the lid is positioned on the fence in the second position, which results in an upward force that pushes the lid away from the fence, and the engagement of the at least one detent within the at least one opening holds the lid in place on the fence in the second position despite the upward force.

15. The shield of claim 11, further comprising a thermal interface material along the underside of the lid such that when the fence is installed to the substrate about the at least one component on the substrate:
  a spaced distance separates the thermal interface material from the at least one component when the lid is positioned on the fence in the first position; and
  the thermal interface material is compressed against the at least one component when the lid is positioned on the fence in the second position, and the thermal interface material defines at least a portion of a thermally-conductive heat path from the at least one component to the lid.

16. A method comprising:
  attaching a lid of a shield to a fence of the shield in a first position such that at least one detent of the lid is engaged within an upper portion of at least one opening of the fence above one or more tabs of the fence and the one or more tabs are disposed under and in contact with the at least one detent such that the lid is held in a raised position relative to the fence and a spaced distance separates an underside of the lid from an upper surface of the fence; and
  moving the lid relatively towards the fence from the first position to a second position in which the at least one detent is engaged within a lower portion of the at least one opening below the one or more tabs and the one or more tabs are disposed above and in contact with the at least one detent such that the lid is held in a lowered position relative to the fence and the spaced distance is substantially eliminated between the underside of the lid and the upper surface of the fence.

17. The method of claim 16, further comprising soldering a bottom of the fence to an upper surface of a printed circuit board when the lid is attached to the fence in the first position, and then after soldering, moving the lid relatively towards the fence from the first position to the second position.

18. The method of claim 16, wherein:
  moving the lid relatively towards the fence from the first position to the second position includes moving an interface material along the underside of the lid such that a spaced distance separating the interface material from at least one component on a printed circuit board when the lid is attached to the fence in the first position is substantially eliminated when the lid is attached to the fence in the second position; and
  the interface material comprises one or more of a thermal interface material, an EMI absorber, a thermally-conductive EMI absorber, an EMI shielding material, and/or a thermally-conductive electrical insulator.

19. The method of claim 16, wherein:
  moving the lid relatively towards the fence from the first position to the second position includes compressing an interface material along the underside of the lid against at least one component on a printed circuit board, which results in an upward force that pushes the lid away from the fence;
  the engagement of the at least one detent within the lower portion of the at least one opening and the contact between the at least one detent and the one or more tabs holds the lid in place on the fence in the second position despite the upward force; and the interface material comprises one or more of a thermal interface material, an EMI absorber, a thermally-conductive EMI absorber, an EMI shielding material, and/or a thermally-conductive electrical insulator.

20. The method of claim 16, wherein moving the lid relatively towards the fence from the first position to the second position includes sliding the at least one detent along the one or more tabs such that the at least one detent moves outwardly from the upper portion of the at least one opening, across and below the one or more tabs, and into the lower portion of the at least one opening below the one or more tabs; and wherein:
attaching the lid to the fence in the first position includes contacting a lower surface of the at least one detent with an upper surface of the one or more tabs, which inhibits downward movement of the lid relative to the fence such that the underside of the lid remains above and spaced apart from the upper surface of the fence; and moving the lid relatively towards the fence from the first position to the second position includes contacting an upper surface of the at least one detent with a lower surface of the one or more tabs, which inhibits upward movement of the lid relative to the fence such that the lid is not removable from the fence without deforming the lid to disengage the at least one detent from the one or more tabs.

* * * * *